US012757311B2

(12) United States Patent
Tychkov et al.

(10) Patent No.: US 12,757,311 B2
(45) Date of Patent: Oct. 6, 2026

(54) OPTICAL SYSTEM AND METHOD FOR A RADIATION SOURCE

(71) Applicant: ASML Netherlands B.V., Veldhoven (NL)

(72) Inventors: Andrey Sergeevich Tychkov, Eindhoven (NL); Alexander Matthijs Struycken, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 191 days.

(21) Appl. No.: 18/718,869

(22) PCT Filed: Dec. 21, 2022

(86) PCT No.: PCT/EP2022/087265

§ 371 (c)(1),
(2) Date: Jun. 12, 2024

(87) PCT Pub. No.: WO2023/111364

PCT Pub. Date: Jun. 22, 2023

(65) Prior Publication Data

US 2025/0008634 A1 Jan. 2, 2025

(30) Foreign Application Priority Data

Dec. 15, 2021 (EP) .................................... 21214601
Jan. 31, 2022 (EP) .................................... 22154302

(51) Int. Cl.
*H05G 2/00* (2006.01)
*G02B 19/00* (2006.01)
*G03F 7/00* (2006.01)

(52) U.S. Cl.
CPC ....... *H05G 2/0086* (2024.08); *G02B 19/0019* (2013.01); *G02B 19/0047* (2013.01);
(Continued)

(58) Field of Classification Search
CPC .............. H05G 2/0086; G02B 19/0019; G02B 19/0047; G03F 7/70033; G03F 7/702; G03F 7/70233
See application file for complete search history.

(56) References Cited

U.S. PATENT DOCUMENTS 9,575,324 B2 2/2017 Lambert
2006/0215712 A1 9/2006 Ziener et al.
(Continued)

FOREIGN PATENT DOCUMENTS

CN 104858547 A 8/2015
CN 111856890 A 10/2020
(Continued)

OTHER PUBLICATIONS

International Search Report and Written Opinion of the International Searching Authority directed to International Patent Application No. PCT/EP2022/087265, mailed Apr. 12, 2023; 13 pages.
(Continued)

*Primary Examiner* — Nicole M Ippolito
(74) *Attorney, Agent, or Firm* — Finnegan, Henderson, Farabow, Garrett & Dunner LLP

(57) ABSTRACT

An optical system for directing first and second laser pulses along an optical axis to a target to generate extreme ultraviolet radiation from said target. The optical system comprises a first optical component configured to redistribute a first laser pulse to form a shaped laser pulse having a hollow region. The optical system comprise a second optical component configured to focus the shaped laser pulse toward the target. The optical system comprises a third optical component configured to focus a second laser pulse toward the target within the hollow region of the shaped laser pulse. The first, second and third optical components are coaxially arranged on the optical axis.

17 Claims, 5 Drawing Sheets

(52) U.S. Cl.
CPC .......... *G03F 7/70033* (2013.01); *G03F 7/702* (2013.01); *G03F 7/70233* (2013.01)

(56) References Cited

U.S. PATENT DOCUMENTS

| | | | | |
|---|---|---|---|---|
| 2011/0309260 | A1* | 12/2011 | Nishisaka | G03B 27/54<br>250/504 R |
| 2012/0241649 | A1 | 9/2012 | Nishihara et al. | |
| 2013/0153794 | A1* | 6/2013 | Wakabayashi | H05G 2/0086<br>250/504 R |
| 2021/0410262 | A1 | 12/2021 | Takashima et al. | |

FOREIGN PATENT DOCUMENTS

| | | | |
|---|---|---|---|
| JP | H02-284782 | A | 11/1990 |
| TW | 201922058 | A | 6/2019 |
| WO | WO 2012/069898 | A1 | 5/2012 |

OTHER PUBLICATIONS

"Optical System and Method for a Radiation Source," Research Disclosure No. 695035, Kenneth Mason Publications, vol. 695, No. 35, Feb. 1, 2022; 25 pages.

* cited by examiner

OPTICAL SYSTEM AND METHOD FOR A RADIATION SOURCE

CROSS-REFERENCE TO RELATED APPLICATIONS

This application claims priority of EP application 21214601.3 which was filed on Dec. 15, 2021 and EP application 22154302.8 which was filed on Jan. 31, 2022 and are incorporated herein in their entirety by reference.

FIELD

The present invention relates to an optical system and method for a radiation source, particularly an optical system for directing first and second laser pulses along an optical axis to a target to generate extreme ultraviolet radiation from said target. The optical system is suitable for use as part of an EUV radiation source and/or a lithographic system.

BACKGROUND

A lithographic apparatus is a machine constructed to apply a desired pattern onto a substrate. A lithographic apparatus can be used, for example, in the manufacture of integrated circuits (ICs). A lithographic apparatus may, for example, project a pattern at a patterning device (e.g., a mask) onto a layer of radiation-sensitive material (resist) provided on a substrate.

To project a pattern on a substrate a lithographic apparatus may use electromagnetic radiation. The wavelength of this radiation determines the minimum size of features which can be formed on the substrate. A lithographic apparatus, which uses extreme ultraviolet (EUV) radiation, having a wavelength within the range 4-20 nm, for example 6.7 nm or 13.5 nm, may be used to form smaller features on a substrate than a lithographic apparatus which uses, for example, radiation with a wavelength of 193 nm.

One system that may be used to generate EUV radiation is a laser produced plasma (LPP) system which involves using a laser to deposit energy via a laser beam into a fuel material. The deposition of laser energy into the fuel material creates a plasma. EUV radiation is emitted from the plasma during de-excitation and recombination of electrons with ions of the plasma.

WO2012069898 discloses an LPP system that uses two laser beams, a main pulse laser beam and a pre-pulse laser beam, to generate EUV radiation from a fuel material. A beam shaping unit is provided on a beam path of the main pulse laser beam for transforming the main pulse laser beam into a hollow laser beam. A first focusing optical element is provided downstream of the beam shaping unit for focusing the hollow laser beam. A second focusing optical element is provided for focusing the pre-pulse laser beam such that the pre-pulse laser beam and the hollow main pulse laser beam travel in the same direction toward the fuel material. The beam shaping of the main pulse laser beam and the focusing of the pre-pulse laser beam occur on different, perpendicular optical axes.

SUMMARY

It is an object of the invention to provide an optical system that improves the generation of EUV radiation from an LPP system.

According to a first aspect of the present disclosure there is provided an optical system for directing first and second laser pulses along an optical axis to a target to generate extreme ultraviolet radiation from said target. The optical system comprises a first optical component configured to redistribute the first laser pulse to form a shaped laser pulse having a hollow region and a second optical component configured to focus the shaped laser pulse toward the target. The optical system comprises a third optical component configured to focus the second laser pulse toward the target within the hollow region of the shaped laser pulse, wherein the first, second and third optical components are coaxially arranged on the optical axis.

The optical system according to the present disclosure advantageously benefits from an increased conversion efficiency compared to optical systems that reshape the first laser pulse and focus the second laser pulse along different axes. The increase in conversion efficiency is, at least in part, due to there being a negligible (or zero) angle between the shaped first laser pulse and the focused second laser pulse, a negligible (or zero) angle between the shaped first laser pulse and the optical axis of the optical system, and a negligible (or zero) angle between the focused second laser pulse and the optical axis of the optical system. In addition, conversion efficiency is further improved because a numerical aperture for the first and second laser pulses is increased compared to known optical systems. Furthermore, conversion efficiency is further improved because the first and second pulses share the same plane.

The optical system according to the present disclosure advantageously benefits from a reduced heat load on (and associated risk of damage to) the optical components included therein compared to known optical systems in which the first and second laser pulses occupy the same region along the optical axis. This is because the first and second laser pulses may interact with different optical elements and/or different portions of optical elements rather than interacting with the same portions of the same optical elements. Furthermore, an optical efficiency of the optical system disclosed herein is increased compared to known optical systems that allow the first and second laser pulses to occupy the same region along the optical axis because different optical components (e.g. different optical elements and/or different portions of the same optical elements) may be tailored to interact with the first and second laser pulses (which may comprise different characteristics, e.g. wavelengths, powers, etc.).

The optical system according to the present disclosure advantageously benefits from an increased stability and reproducibility of spatial profiles of the first and second laser pulses at the target compared to known optical systems used in known EUV radiation sources. This is because the coaxial arrangement enables more evenly distributed spatial profiles of the first and second laser pulses at the target compared to known optical systems used in known EUV radiation sources. Furthermore, redistributing the spatial profile of the first laser pulse ensures that the energy of the first laser pulse is retained rather than at least partially lost. In addition, the coaxial arrangement of optical components provides a compact design comprising easy to repair and/or replace optical components.

The words “first and “second” and the like are merely used to identify different features, and do not denote a temporal or spatial order. The first laser pulse may be incident on the target after the second laser pulse is incident on the target.

The plurality of optical components may comprise reflective optical components. The plurality of optical components may comprise transmissive optical components.

The first and second laser pulses may comprise different wavelengths.

The target may be a droplet of fuel (e.g. tin).

The second laser pulse may be configured to change a shape of the target. For example, the second laser pulse may be configured to change the target from a droplet shape to a pancake shape.

The second laser pulse may comprise a wavelength of about 1030 nm.

The first laser pulse may be configured to cause the target to emit extreme ultraviolet radiation. For example the first laser pulse may convert the target into a plasma that emits extreme ultraviolet radiation.

The first laser pulse may comprise a wavelength of about 10.6 μm.

The first optical component and the third optical component may be located on different surfaces of a single optical element.

This arrangement advantageously reduces the number of optical elements compared to known optical systems, thereby reducing cost and complexity whilst simplifying repair and replacement compared to known optical systems.

The first optical component may be formed on a front side of the single optical element. The third optical component may be formed on a back side of the single optical element.

The optical system may comprise a radiation collector configured to receive extreme ultraviolet radiation emitted by the target. The radiation collector may comprise an aperture coaxially arranged on the optical axis. The second and third optical components may be configured to focus the shaped and second laser pulses through the aperture.

Having a collector aperture that is coaxial with the shaped and second laser pulses and the target advantageously increases a conversion efficiency of the optical system (when generating EUV radiation) compared to known optical systems that form the shaped and second laser pulses along different axes and/or locate the collector aperture off-axis.

The second optical component may be configured to interact with the shaped laser pulse only. The third optical component may be configured to interact with the second laser pulse only.

This arrangement advantageously enables optical components to be tailored to different characteristics (e.g. wavelengths) of first and second pulses.

The second optical component may comprise an opening coaxially arranged on the optical axis.

This arrangement advantageously provides a more compact system compared to known optical systems.

The third optical component may be configured to focus a third laser pulse along the optical axis to the target within the hollow region of the shaped laser pulse. The third laser pulse may comprise a different wavelength to the first and second laser pulses.

The third laser pulse may be incident on the target after the first laser pulse and before the second laser pulse.

The third laser pulse may be configured to prepare the target for receipt of the second laser pulse. For example, the third laser pulse may be configured to atomize the target (i.e. convert the pancake droplet to many small particles, similar to a gaseous state) in preparation for receipt of the first laser pulse for the generation of EUV radiation. The third laser pulse may act to increase an absorption of the first laser pulse by the target.

The third laser pulse may have a wavelength of about 1064 nm.

According to a second aspect of the present disclosure, there is provided an extreme ultraviolet radiation source comprising the optical system of the first aspect.

According to a third aspect of the present disclosure, there is provided a lithographic system comprising the extreme ultraviolet radiation source of the second aspect.

According to a fourth aspect of the present disclosure, there is provided a method of directing first and second laser pulses along an optical axis to a target to generate extreme ultraviolet radiation from said target. The method comprises using a first optical component to redistribute the first laser pulse to form a shaped laser pulse having a hollow region and using a second optical component to focus the shaped laser pulse toward the target. The method further comprises using a third optical component to focus the second laser pulse toward the target within the hollow region of the shaped laser pulse. The method also comprises coaxially arranging the first, second and third optical components on the optical axis.

The first and second laser pulses may comprise different wavelengths of radiation.

The method may comprise locating the first optical component and the third optical component on different surfaces of a single optical element.

The method may comprise locating the first optical component on a front side of the single optical element and locating the third optical component on a back side of the single optical element.

The method may comprise using a radiation collector to receive extreme ultraviolet radiation emitted by the target. The method may comprise arranging an aperture of the radiation collector coaxially on the optical axis. The method may comprise using the second and third optical components to focus the shaped and second laser pulses through the aperture.

The method may comprise using the second optical component to interact with the shaped laser pulse only. The method may comprise using the third optical component to interact with the second laser pulse only. The method may comprise providing an opening in the second optical component and coaxially arranging the opening on the optical axis. The method may comprise using the third optical component to focus a third laser pulse along the optical axis to the target within the hollow region of the shaped pulse. The third laser pulse may comprise a different wavelength to the first and second laser pulses.

According to a fifth aspect of the present disclosure, there is provided a method of projecting a patterned beam of radiation onto a substrate, comprising using the method of the fourth aspect to generate extreme ultraviolet radiation.

BRIEF DESCRIPTION OF THE DRAWINGS

Embodiments of the invention will now be described, by way of example only, with reference to the accompanying schematic drawings, in which.

DETAILED DESCRIPTION

Figure 1:
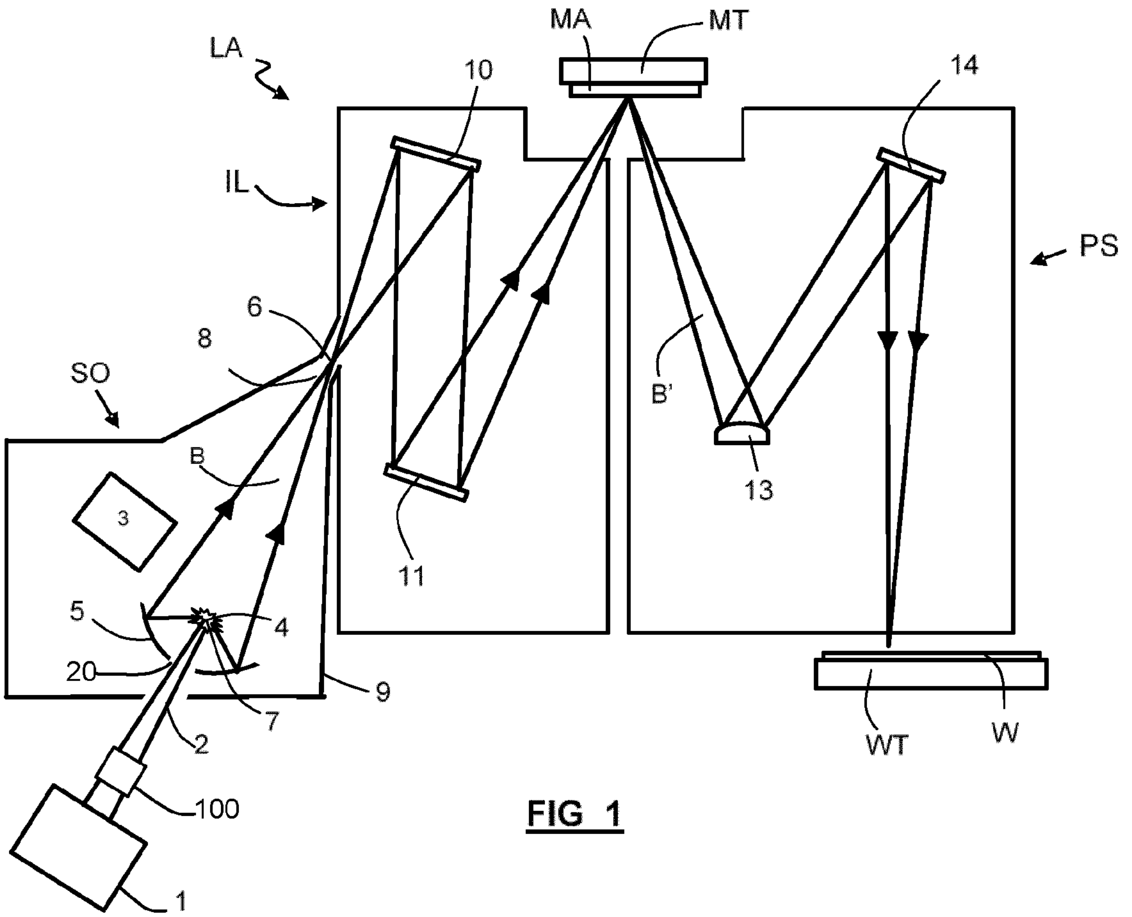
FIG. 1 depicts a lithographic system comprising a lithographic apparatus, a radiation source and an optical system according to an embodiment of the present disclosure.

FIG. 1 shows a lithographic system comprising a radiation source SO and a lithographic apparatus LA. The radiation source SO is configured to generate an EUV radiation beam B and to supply the EUV radiation beam B to the lithographic apparatus LA. The lithographic apparatus LA comprises an illumination system IL, a support structure MT configured to support a patterning device MA (e.g., a mask), a projection system PS and a substrate table WT configured to support a substrate W.

The illumination system IL is configured to condition the EUV radiation beam B before the EUV radiation beam B is incident upon the patterning device MA. Thereto, the illumination system IL may include a facetted field mirror device 10 and a facetted pupil mirror device 11. The faceted field mirror device 10 and faceted pupil mirror device 11 together provide the EUV radiation beam B with a desired cross-sectional shape and a desired intensity distribution. The illumination system IL may include other mirrors or devices in addition to, or instead of, the faceted field mirror device 10 and faceted pupil mirror device 11.

After being thus conditioned, the EUV radiation beam B interacts with the patterning device MA. As a result of this interaction, a patterned EUV radiation beam B' is generated. The projection system PS is configured to project the patterned EUV radiation beam B' onto the substrate W. For that purpose, the projection system PS may comprise a plurality of mirrors 13,14 which are configured to project the patterned EUV radiation beam B' onto the substrate W held by the substrate table WT. The projection system PS may apply a reduction factor to the patterned EUV radiation beam B', thus forming an image with features that are smaller than corresponding features on the patterning device MA. For example, a reduction factor of 4 or 8 may be applied. Although the projection system PS is illustrated as having only two mirrors 13, 14 in FIG. 1, the projection system PS may include a different number of mirrors (e.g., six or eight mirrors).

The substrate W may include previously formed patterns. Where this is the case, the lithographic apparatus LA aligns the image, formed by the patterned EUV radiation beam B', with a pattern previously formed on the substrate W.

A relative vacuum, i.e. a small amount of gas (e.g. hydrogen) at a pressure well below atmospheric pressure, may be provided in the radiation source SO, in the illumination system IL, and/or in the projection system PS.

The radiation source SO shown in FIG. 1 is, for example, of a type which may be referred to as a laser produced plasma (LPP) source. A laser system 1, which may, for example, include a $CO_2$ laser, is arranged to deposit energy via two or more laser pulses 2 having different wavelengths into a fuel, such as tin (Sn) which is provided from, e.g., a fuel emitter 3. Although tin is referred to in the following description, any suitable fuel may be used. The fuel may, for example, be in liquid form, and may, for example, be a metal or alloy. The fuel emitter 3 may comprise a nozzle configured to direct tin, e.g. in the form of droplets, along a trajectory towards a plasma formation region 4. The laser pulses 2 are incident upon the tin at the plasma formation region 4. The deposition of laser energy into the tin creates a tin plasma 7 at the plasma formation region 4. Radiation, including EUV radiation, is emitted from the plasma 7 during de-excitation and recombination of electrons with ions of the plasma.

The lithographic apparatus LA comprises an optical system 100 for directing the laser pulses 2 along an optical axis to the tin at the plasma formation region 4 to generate EUV radiation. An example of the optical system 100 is shown in greater detail in FIG. 2. An example of an alternative optical system 400 that may be used as part of the lithographic apparatus LA is shown in detail in FIG. 4. The optical system 100 or the alternative optical system 400 may be considered to be part of the radiation source SO for generating EUV radiation.

The EUV radiation from the plasma is collected and focused by a collector 5. The collector 5 comprises, for example, a near-normal incidence radiation collector 5 (sometimes referred to more generally as a normal-incidence radiation collector). The collector 5 may have a multilayer mirror structure which is arranged to reflect EUV radiation (e.g., EUV radiation having a desired wavelength such as 13.5 nm). The collector 5 may have an ellipsoidal configuration, having two focal points. A first one of the focal points may be at the plasma formation region 4, and a second one of the focal points may be at an intermediate focus 6, as discussed below. The collector 5 may comprise an aperture 20 through which the laser pulses 2 travel to reach the plasma formation region 4.

The laser system 1 may be spatially separated from the radiation source SO. Where this is the case, the laser pulses 2 may be passed from the laser system 1 to the radiation source SO with the aid of a beam delivery system (not shown) comprising, for example, suitable directing mirrors and/or a beam expander, and/or other optics. The laser system 1, the radiation source SO and the beam delivery system may together be considered to be a radiation system.

Radiation that is reflected by the collector 5 forms the EUV radiation beam B. The EUV radiation beam B is focused at intermediate focus 6 to form an image at the intermediate focus 6 of the plasma present at the plasma formation region 4. The image at the intermediate focus 6 acts as a virtual radiation source for the illumination system IL. The radiation source SO is arranged such that the intermediate focus 6 is located at or near to an opening 8 in an enclosing structure 9 of the radiation source SO.

Figure 2:
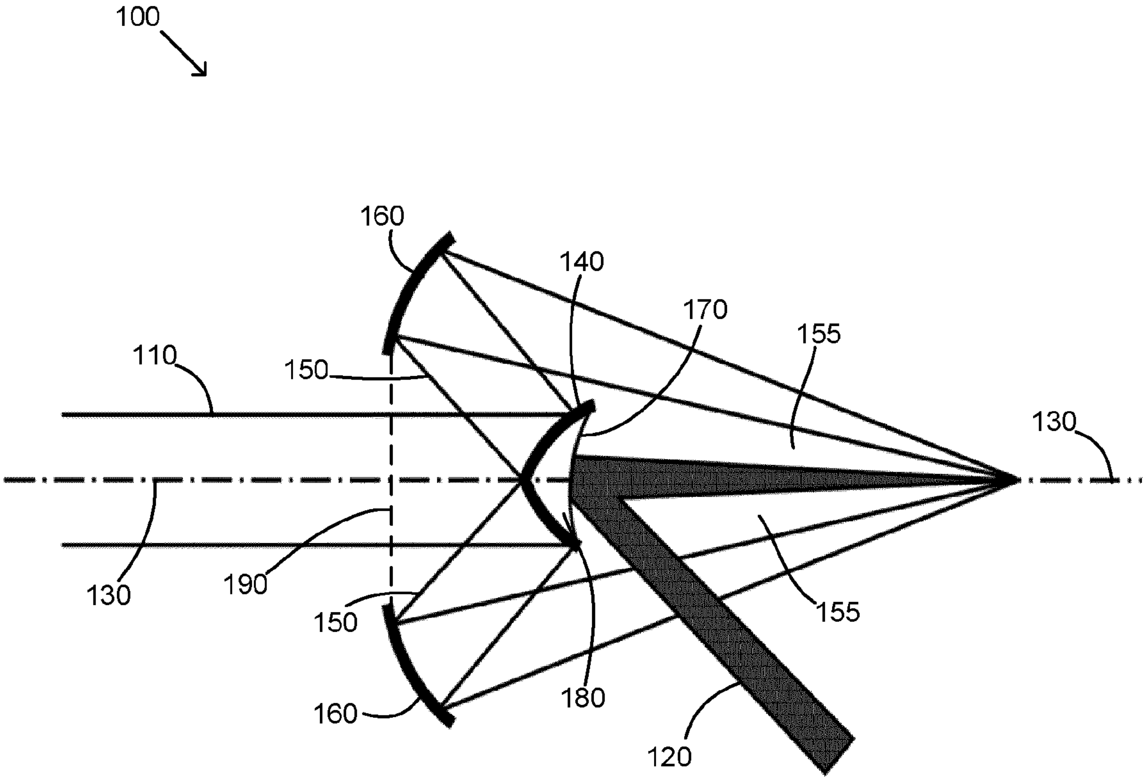
FIG. 2 schematically depicts a cross-sectional side view of an optical system for directing first and second laser pulses along an optical axis to a target to generate EUV radiation from said target according to an embodiment of the present disclosure.
Figure 3:
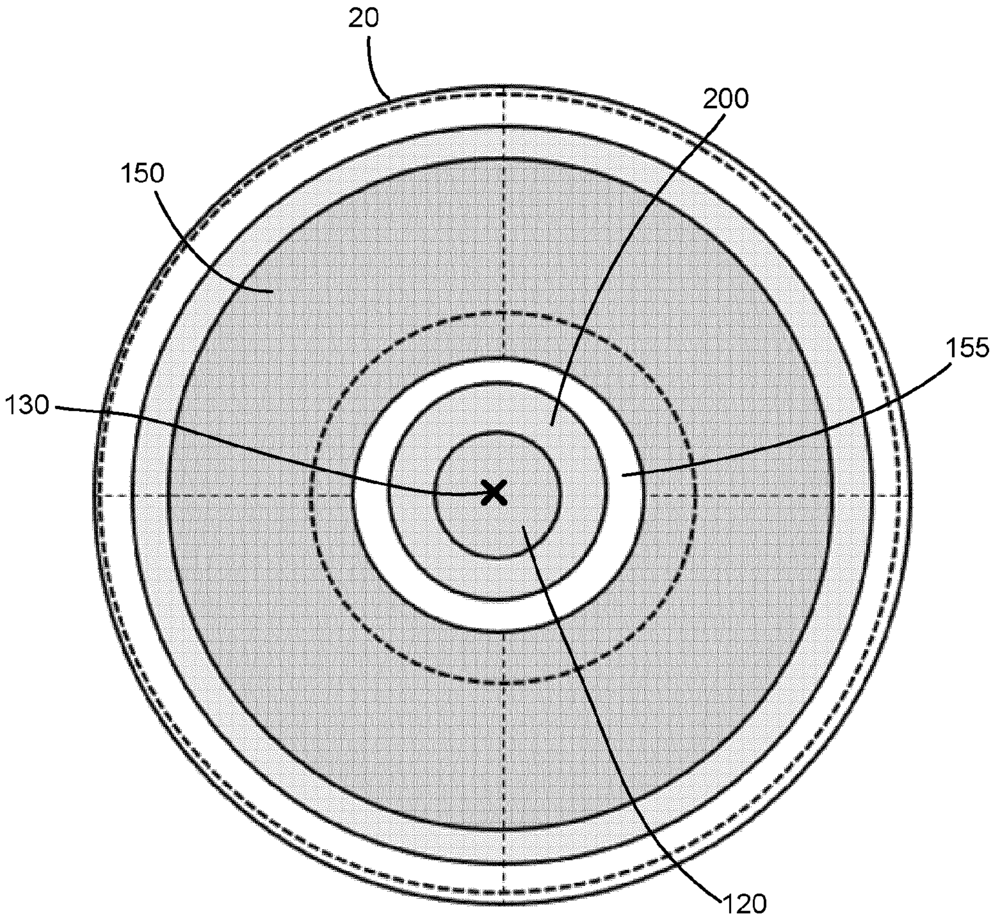
FIG. 3 schematically depicts a front view of an aperture of a radiation collector that forms part of the lithographic system of FIG. 1.

FIG. 2 schematically depicts a cross-sectional side view of an optical system 100 for directing first and second laser pulses 110, 120 along an optical axis 130 to a target (not shown) to generate EUV radiation from said target. The target may be a droplet of fuel (e.g. tin) present at a plasma formation location 4 such as the one shown in FIG. 1. The optical system 100 comprises a first optical component 140 configured to redistribute the first laser pulse 110 to form a shaped laser pulse 150 having a hollow region 155. In the example of FIG. 1, the first optical component 140 comprises an axicon mirror having a convex reflective surface upon which the first laser pulse 110 is incident. The convex surface may comprise an off-axis parabola. In the example of FIG. 1, the first optical component 140 is generally conical. The first optical component 140 may take other shapes. An apex of the convex conical reflective surface is coaxially arranged on the optical axis 130. The first optical component 140 spatially redistributes the energy of the first laser pulse 110. The axicon mirror of the first optical component 140 spatially redistributes the energy of the first laser pulse 110 by reflecting different portions of the first laser pulse 110 in different directions to form a shaped laser pulse 150. In the example of FIG. 2, the shaped laser pulse 150 takes the form of a hollow cone having an annular cross-section (an example of which, as seen along the optical axis 130, is shown in FIG. 3). It will be appreciated that the shaped laser pulse 150 may take the form of other shapes comprising a hollow region.

In the example of FIG. 2, the optical system 100 may comprise the features described in the above paragraph. Additionally, a shaped laser pulse may be also understood as a shaped beam pulse or a shaped beam. In an additional embodiment, the first optical component 140 may be conical, spherical, aspherical or with a free-form.

The optical system 100 comprises a second optical component 160 configured to focus the shaped laser pulse 150 toward the target. In the example of FIG. 2, the second optical component 160 comprises a focusing mirror having a concave reflective surface upon which the shaped laser pulse 150 is incident. The first optical component 140 forms the shaped laser pulse 150 and directs the shaped laser pulse 150 towards the concave reflective surface of the second optical element 160 via reflection of the first laser pulse 110. The concave reflective surface of the second optical component 160 reflects and focuses the shaped laser pulse 150 towards a target (e.g. a droplet of fuel at a plasma formation location 4 such as the one shown in FIG. 1). The second optical component 160 comprises an opening 190 coaxially arranged on the optical axis 130. That is, a center of the opening 190 of the second optical component 160 is coaxially arranged on the optical axis 130. As such, the concave reflective surface of the second optical element 160 takes the form of a concave annulus that surrounds the optical axis 130. The opening 190 is shown with a dashed line in FIG. 2. The first laser pulse 110 propagates through the aperture 190 along the optical axis 130 to reach the first optical component 140.

The optical system 100 comprises a third optical component 170 configured to focus the second laser pulse 120 toward the target within the hollow region 155 of the shaped laser pulse 150. That is, the third optical component 170 directs and focuses the second laser pulse 120 along the optical axis 130 to the target such that the second laser pulse 120 propagates within the hollow region 155 of the shaped laser pulse 150. A circular cross-section of the second laser pulse 120 is nested within the inner circle of the annular cross-section of the shaped laser pulse 150 (an example of which, as seen along the optical axis 130, is shown in FIG. 3). In the example of FIG. 2, the third optical component 170 comprises a focusing mirror having a concave reflective surface upon which the second laser pulse 120 is incident. The first, second and third optical components 140, 160, 170 are coaxially arranged on the optical axis 130, and are therefore coaxially arranged with respect to each other and the target (e.g. the plasma formation location 4 of FIG. 1).

Advantageously, the coaxial arrangement of the first, second and third optical components 140, 160, 170 allows to point the laser pulses 110, 120 (or laser beams) coaxially in to the plasma formation region location 4 and interact with the target even if in the case the target is slightly off axis.

In another embodiment, the third optical component 170 comprises a focusing mirror having a concave reflective surface or a flat surface upon which the second laser pulse 120 is incident. In the embodiment wherein the third optical component 170 comprises a mirror having a flat surface, the optical system 100 further comprises an additional focusing system (not shown in the figures) positioned in the upstream configured to focus the second laser pulse 120.

In the example of FIG. 2, the first optical component 140 and the third optical component 170 are located on different surfaces of a single optical element 180. The first optical component 140 is formed on a front side of the single optical element 180 that faces the first laser pulse, and the third optical component 170 is formed on a back side of the single optical element 180 that faces the target. That is, the convex conical surface of the axicon mirror of the first optical component 140 is located on the front side of the single optical element 180 and the concave reflective surface of the focusing mirror of the third optical component 170 is located on the back side of the single optical element 180. This arrangement advantageously contributes to a compactness of the optical system 100.

The first optical component 140 is configured to interact with the first laser pulse 110 only. The second optical component 160 is configured to interact with the shaped laser pulse 150 only. The third optical component 170 is configured to interact with the second laser pulse 120 only. This advantageously allows each optical component 140, 160, 170 to be tailored towards interacting with its respective laser pulse 110, 120. For example, the first laser pulse 110, and therefore the shaped laser pulse 150, may have a wavelength of about 10.6 μm. The first laser pulse 110 may be a CO2 laser pulse (i.e. generated by a carbon dioxide laser). The first and second optical components 140, 160 may therefore be designed specifically to be as reflective as possible for wavelengths of about 10.6 μm. For example, the first and/or second optical components 140, 160 may comprise a reflective coating material such as, for example, Copper, Silicon Carbide, Silicon, coated steel, etc. As another example, the second laser pulse 120 may have a wavelength of about 1030 nm or 1064 nm. The second laser pulse 120 may be a pulse generated in a solid state laser, such as a YAG laser. The third optical component 170 may therefore be designed specifically to be as reflective as possible for wavelengths of about 1030 nm or 1064 nm. For example, the third optical component 170 may comprise a reflective coating material such as, for example, Silver, Gold, etc. Devoting different optical components 140,160, 170 to different laser pulses 110, 120 also advantageously reduces the risk of the optical components overheating and thereby deforming or becoming damaged compared to known optical system that use a single optical element to interact with both laser pulses.

Additionally, the optical system of the present invention advantageously makes easier the coating selection process, allowing using well known coatings for each laser pulses or laser beams.

Whilst FIG. 2 only shows first and second laser pulses 110, 120, the optical system 100 may direct further laser pulses to the target. For example, the third optical component 170 may be configured to focus a third laser pulse (not shown) along the optical axis 130 to the target within the hollow region 155 of the shaped laser pulse 150. An example of the relative locations of the first, second and third laser pulses from a perspective view along the optical axis 130 is shown in FIG. 3.

FIG. 3 schematically depicts a front view of the aperture 20 of the radiation collector of FIG. 1. The aperture 20 of the radiation collector is coaxially arranged on the optical axis 130. As such, the aperture 20 of the radiation collector is coaxially aligned with respect to the first, second and third optical components 140, 160, 170 and the target (e.g. the plasma formation location 4 of FIG. 1). The view shown in FIG. 3 may be considered a numerical aperture view along the optical axis 130. That is, the spaces occupied by the different laser pulses 120,150, 200 may correspond to different angles of incidence occupied by said laser pulses. The second pulse 120 has a circular cross-sectional shape that is centered on the optical axis 130. The third laser pulse 200 also has a circular cross-sectional shape that is centered on the optical axis 130. A diameter of the third laser pulse 200 is greater than a diameter of the second laser pulse 120. The shaped laser pulse 150 has an annular cross-sectional shape that is centered on the optical axis 130. The hollow region 155 of the shaped laser pulse 150 has an annular cross-sectional shape that is centered on the optical axis 130. The second laser pulse 120 and the third laser pulse 200 are located within the hollow region 155 of the shaped laser beam 150.

The second optical component (not shown in FIG. 3) is configured to focus the shaped laser pulse 150 through the aperture 20 and towards the target. The third optical component (not shown in FIG. 3) is configured to focus the second laser pulse 120 through the aperture 20 and towards the target. When propagating along the optical axis 130 towards the target, the shaped laser pulse 150 does not occupy the same space as the second and third laser pulses 120, 200, whereas part of the third laser pulse 200 occupies the same space as the second laser pulse 120. However, each laser pulse 120, 150, 200 is focused toward the target and therefore may be incident upon the same portions of the target.

In another embodiment, laser pulses 120 and 200 may be located next to each other on the third optical component 170. Therefore, the third optical component 170 is configured to focus said pulses even if they are placed in different areas of said third optical component 170. This means that the second laser pulse 120 and the third laser pulse 200 are close to the axis. Therefore, the angle with respect to the optical axis 130 is reduced in comparison with other arrangements of the state of the art, which in turn advantageously increases the conversion efficiency of the extreme ultraviolet radiation source SO.

It will be appreciated that each laser pulse 120, 150, 200 travels along the optical axis 130 and arrives at the target at different times. The view of FIG. 3 shows all three laser pulse at once in order to demonstrate the relative positions of the laser pulses 120, 150, 200 for ease of understanding.

Each laser pulse comprises one or more different characteristics (e.g. wavelength, power, shape, etc.) for interacting with the target in different ways. The second laser pulse 120 may arrive at the target first. The second laser pulse 120 may be configured to change a shape of the target. For example, the second laser pulse 120 may be configured to change the target from a droplet shape to a flattened circular, or "pancake" shape. The second laser pulse 120 may comprise a wavelength of about 1030 nm or about 1064 nm. The second laser pulse 120 may be generated by one or more of any suitable lasers such as, for example, a solid state laser, a semiconductor laser, etc.

The third laser pulse 200 may arrive at the target second. That is, the third laser pulse 200 may be incident on the target after the second laser pulse 120 and before the first laser pulse 110. The third laser pulse 200 may be configured to prepare the target for receipt of the first laser pulse 110. For example, the third laser pulse 200 may be configured to atomize the target (i.e. convert the pancake droplet to many small particles, similar to a gaseous state) in preparation for receipt of the first laser pulse 110 for the generation of EUV radiation. The third laser pulse 200 may act to increase an absorption of the first laser pulse 110 by the target. The third laser pulse 200 may have a wavelength of about 1064 nm. The third laser pulse 200 may be generated by one or more of any suitable lasers such as, for example, a solid state laser, a semiconductor laser, etc. A single laser may be used to generate the second laser pulse 120 and the third laser pulse 200.

It should be understood that another definition of atomizing the target may be rarifying the target.

The first laser pulse 110 may arrive at the target last. That is, the first laser pulse 110 may be incident on the target after the second laser pulse 120 and the third laser pulse 200. The first laser pulse 110 may be configured to cause the target to emit EUV radiation. For example, the first laser pulse 110 may convert the target into a plasma that emits EUV radiation. The first laser pulse 110 may comprise a wavelength of about 10.6 μm. The first laser pulse 110 may be generated by one or more of any suitable lasers such as, for example, a $CO_2$ laser.

As previously discussed with reference to FIG. 1, radiation that is reflected by the collector 5 forms the EUV radiation beam B. The EUV radiation beam B is focused at intermediate focus 6 to form an image at the intermediate focus 6 of the plasma present at the plasma formation region 4. The image at the intermediate focus 6 acts as a virtual radiation source for the illumination system IL. The coaxial arrangement of the laser pulses 120, 150, 200 (e.g. as shown in FIG. 3) provides multiple advantages due to a reduction in an angular offset between the laser pulses 120, 150, 200 and the optical axis 130 compared to known optical systems.

The example of the previous paragraph may be applicable for lithography systems with high numerical aperture NA optics. For EUV lithography systems, it should be understood as high NA a system with NA above 0.33, for example 0.55. High NA optics results in shorter effective focal length of said optics. The coaxial arrangement of the laser pulses 120, 150, 200 (e.g. as shown in FIG. 3) provides an additional advantage for high NA systems: a lower sensitivity of beam focus position to input beam tilt. It is known that this tilt may be originated due to the laser jitter. Therefore, the optical system of the present invention advantageously produces a more stable EUV radiation dose in high NA EUV lithography systems.

The coaxial arrangement of the laser pulses 120, 150, 200 reduces an angle between the angle of incidence of the first laser pulse 110 on the target and an angle of incidence of the second laser pulse 120 on the target compared to known optical systems. This advantageously improves an efficiency of a radiation source SO and/or a lithographic apparatus LA comprising the optical system 100 because less EUV radiation is lost at the target and/or in the far field (i.e. in the illumination system IS and/or projection system PS of the lithographic apparatus LA). The angle between the angle of incidence of the first laser pulse 110 on the target and the angle of incidence of the second laser pulse 120 on the target may be substantially zero.

The coaxial arrangement of the laser pulses 120, 150, 200 reduces an angle between the angle of incidence of the first laser pulse 110 at the target and the optical axis 130 upon which the aperture 20 of the radiation collector is centered compared to known optical systems. This advantageously improves an efficiency of a radiation source SO and/or a lithographic apparatus LA comprising the optical system 100 because less EUV radiation is lost through a tilt in the EUV radiation in the far field (i.e. in the illumination system IS and/or projection system PS of the lithographic apparatus LA). In addition, losses of EUV radiation at the intermediate focus 6 are reduced due to the image of the plasma at the intermediate focus (i.e. the virtual radiation source for the illumination system IS) not being tilted. The angle between the angle of incidence of the first laser pulse 110 at the target and the optical axis 130 upon which the aperture 20 of the radiation collector is centered may be substantially zero.

The coaxial arrangement of the laser pulses 120, 150, 200 increases a numerical aperture available to the laser pulses 110, 120, 200 compared to known optical systems. Increasing the numerical aperture available to the laser pulses 110, 120, 200 advantageously decreases a presence of optical aberrations which may in turn reduce losses of EUV radiation and/or reduce the strength of unwanted back reflections occurring in the optical system 100 and/or the lithographic apparatus LA. Increasing the numerical aperture available to the laser pulses 110, 120, 200 also advantageously reduces a limit on the size of the third laser pulse 200 at the target, which may in turn improve an efficiency with which EUV radiation is generated.

The coaxial arrangement of the laser pulses 120, 150, 200 advantageously increases the conversion efficiency of the extreme ultraviolet radiation source SO.

The coaxial arrangement of the laser pulses 120, 150, 200 advantageously increases a stability and reproducibility of the beam profile of the first laser pulse 110 incident on the target, which in turn improves an efficiency and stability of EUV generation and lithographic printing when incorporating the optical system 100.

The optical system of FIG. 2 is an example of an optical system comprising reflective components. Compact, coaxial optical systems comprising other optical components, e.g. transmissive optical components, may also be used.

Figure 4:
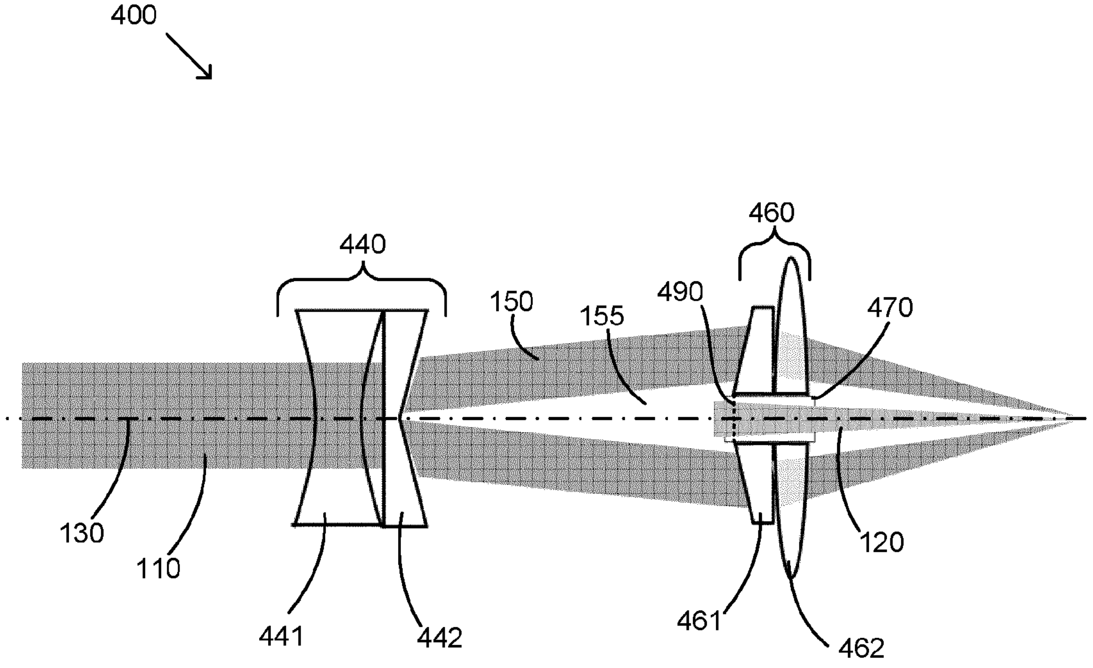
FIG. 4 schematically depicts a cross-sectional side view of an alternative optical system comprising transmissive optical components according to an embodiment of the disclosure.

FIG. 4 schematically depicts a cross-sectional side view of an alternative optical system 400 comprising transmissive optical components according to an embodiment of the present disclosure. As is the case with the optical system 100 of FIG. 2, the alternative optical system 400 is suitable for directing first and second laser pulses 110, 120 along an optical axis 130 to a target (e.g. a fuel droplet at the plasma formation region 4 shown in FIG. 1) to generate EUV radiation from said target. The alternative optical system 400 comprises a first optical component 440 configured to redistribute the first laser pulse 110 to form a shaped laser pulse 150 having a hollow region 155. In the example of FIG. 4, the first optical component 440 comprises a first optical element 441 and a second optical element 442. The first optical element 441 comprises a beam expander configured to convert the first laser pulse 110 into a divergent beam. The second optical element 442 comprises an axicon lens configured to receive the first laser pulse 110 from the first optical element 441 and spatially redistribute the energy of the first laser pulse 110. The axicon lens of the second optical element 442 spatially redistributes the energy of the first laser pulse 110 by transmitting different portions of the first laser pulse 110 in different directions to form a shaped laser pulse 450 having a hollow region 155.

The alternative optical system 400 comprises a second optical component 460 configured to focus the shaped laser pulse 150 towards the target. In the example of FIG. 4, the second optical component 460 comprises a third optical element 461 and a fourth optical element 462. The third optical element 461 comprises a collimator configured to collimate the shaped laser pulse 150. The fourth optical element 462 comprises a lens configured to receive the shaped laser pulse 150 from the third optical element 461 and focus the shaped laser pulse 150 along the optical axis 130 towards the target (not shown)

The alternative optical system 400 comprises a third optical component 470 configured to focus the second laser pulse 120 toward the target within the hollow region 455 of the shaped laser pulse 450. In the example of FIG. 4, the third optical component 470 comprises a lens configured to focus the second laser pulse 120 along the optical axis 130 toward the target within the hollow region 455 of the shaped laser pulse 450. The first, second and third optical components 440, 460, 470 are coaxially arranged on the optical axis 130.

In another embodiment the third optical element may be an opening or an aperture. In said embodiment, an additional optical element may be located upstream configured to focus the second laser pulse 120.

Despite comprising transmissive components rather than reflective components, the alternative optical system 400 conditions laser pulses 110, 120 to achieve the same result as the optical system 100 of FIG. 2 (i.e. the coaxial arrangement of laser pulses 110, 150, 200 shown in FIG. 3). The alternative optical system 400 may comprise a radiation collector (not shown) configured to receive EUV radiation emitted by the target, and the radiation collector may comprise an aperture coaxially arranged on the optical axis 130. The second and third optical components 460, 470 may be configured to focus the shaped and second laser pulses 150, 120 through the aperture of the radiation collector. The second optical component 460 comprises an opening 490 coaxially arranged on the optical axis 130. The third optical component 470 may be configured to focus a third laser pulse (not shown) along the optical axis 130 to the target within the hollow region 455 of the shaped laser pulse 450. The third laser pulse may comprise a different wavelength to the first and second laser pulses 110, 120 (e.g. the third laser pulse may be the third laser pulse 200 shown in FIG. 3).

The first optical component 440 is configured to interact with the first laser pulse 110 only. The second optical component 460 is configured to interact with the shaped laser pulse 150 only. The third optical component 470 is configured to interact with the second laser pulse 120 only. This advantageously allows each optical component 440, 460, 470 to be tailored towards interacting with its respective laser pulse 110, 120. For example, the first laser pulse 110, and therefore the shaped laser pulse 150, may have a wavelength of about 10.6 μm. The first and second optical components 440, 460 may therefore be designed specifically to be as transmissive as possible for wavelengths of about 10.6 μm. For example, the first and/or second optical components 140, 160 may comprise a material such as ZnSe. As another example, the second laser pulse 120 may have a wavelength of about 1030 nm or about 1064 nm. The third optical component 470 may therefore be designed specifically to be as reflective as possible for wavelengths of about 1030 nm or about 1064 nm. For example, the third optical component 170 may comprise a material such as Quartz, Fused Silica, BK7, etc. Devoting different optical components 440, 460, 470 to different laser pulses 110, 120 also advantageously reduces the risk of the optical components overheating and thereby deforming or becoming damaged compared to known optical system that use a single optical element to interact with both laser pulses.

Figure 5:
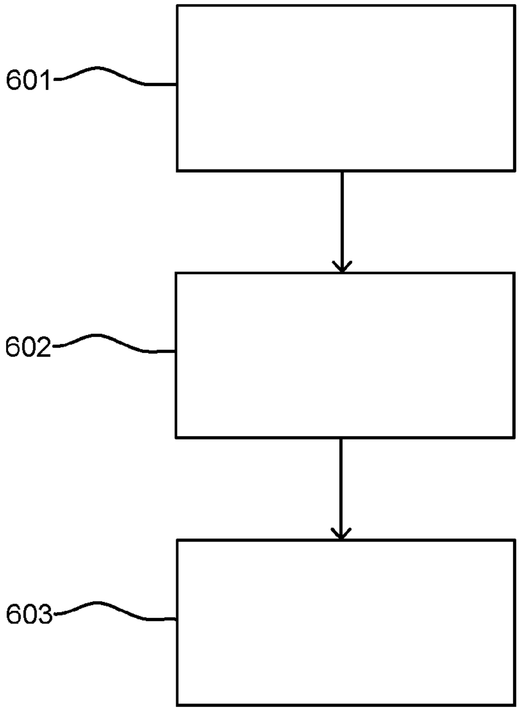
FIG. 5 shows a flowchart of a method of directing first and second laser pulses along an optical axis to a target to generate extreme ultraviolet radiation from said target according to an embodiment of the present disclosure.

FIG. 5 shows a flowchart of a method of directing first and second laser pulses along an optical axis to a target to generate extreme ultraviolet radiation from said target according to an embodiment of the present disclosure. It will be appreciated that use of the wording "first step", "second step", etc. does not indicate a temporal order of the steps, and is rather merely used to differentiate steps of the method.

For example, the second step 602 may be performed before the first step 601. It will be appreciated, as explained above, that the various pulses are not incident on the target simultaneously. A first step 601 of the method comprises using a first optical component to redistribute a first laser pulse to form a shaped laser pulse having a hollow region. A second step 602 of the method comprises using a second optical component to focus the shaped laser pulse toward the target. A third step 603 of the method comprises using a third optical component to focus a second laser pulse toward the target within the hollow region of the shaped laser pulse. A fourth step 604 of the method comprises coaxially arranging the first, second and third optical components on the optical axis. It will be appreciated that the optical system 100 of FIG. 2 or the alternative optical system 400 of FIG. 4 may be used to perform the method of FIG. 5.

The method may comprise an optional step of locating the first optical component and the third optical component on different surfaces of a single optical element (e.g. the single optical element 180 shown in FIG. 2). The method may comprise an optional step of locating the first optical component on a front side of the single optical element. The method may comprise an optional step of locating the third optical component on a back side of the single optical element.

The method may comprise an optional step of using a radiation collector to receive extreme ultraviolet radiation emitted by the target (e.g. the radiation collector 5 shown in FIG. 1). The method may comprise an optional step of arranging an aperture of the radiation collector coaxially on the optical axis (e.g. the aperture 20 shown in FIG. 3).

The method may comprise an optional step of using the second and third optical components to focus the shaped and second laser pulses through the aperture (e.g. the coaxial arrangement shown in FIG. 3 as performed by the optical systems of FIG. 2 or FIG. 4).

The method may comprise an optional step of using the first optical component to interact with the first laser pulse only. The method may comprise an optional step of using the second optical component to interact with the shaped laser pulse only. The method may comprise an optional step of using the third optical component to interact with the second laser pulse only. Each of these optional steps is demonstrated by for example, the optical systems of FIGS. 2 and 4.

The method may comprise an optional step of providing an opening in the second optical component. The method may comprise an optional step of coaxially arranging the opening on the optical axis. Each of these optional steps is demonstrated by for example, the optical systems of FIGS. 2 and 4.

The method may comprise an optional step of using the third optical component to focus a third laser pulse along the optical axis to the target within the hollow region of the shaped pulse. The third laser pulse may comprise a different wavelength to the first and second laser pulses. Each of these optional steps is demonstrated by for example, the coaxial arrangement of FIG. 3 as performed by the optical systems of FIG. 2 (or FIG. 4).

A method of projecting a patterned beam of radiation onto a substrate, may comprise using the method of FIG. 5, and any optional steps thereof, to generate extreme ultraviolet radiation (e.g. as shown by the optical system 100 forming part of the lithographic apparatus LA of FIG. 1).

Although specific reference may be made in this text to the use of lithographic apparatus in the manufacture of ICs, it should be understood that the lithographic apparatus described herein may have other applications. Possible other applications include the manufacture of integrated optical systems, guidance and detection patterns for magnetic domain memories, flat-panel displays, liquid-crystal displays (LCDs), thin-film magnetic heads, etc.

Although specific reference may be made in this text to embodiments of the invention in the context of a lithographic apparatus, embodiments of the invention may be used in other apparatus. Embodiments of the invention may form part of a mask inspection apparatus, a metrology apparatus, or any apparatus that measures or processes an object such as a wafer (or other substrate) or mask (or other patterning device). These apparatus may be generally referred to as lithographic tools. Such a lithographic tool may use vacuum conditions or ambient (non-vacuum) conditions.

Where the context allows, embodiments of the invention may be implemented in hardware, firmware, software, or any combination thereof. For example, the embodiments of the invention may be implemented using a computer program comprising computer readable instructions configured to cause a computer to carry out a method according to the invention. Embodiments of the invention may include a computer readable medium carrying said computer program. As another example, embodiments of the invention may be implemented using a computer apparatus comprising a memory storing processor readable instructions and a processor arranged to read and execute instructions stored in said memory. Said processor readable instructions may comprise instructions arranged to control the computer to carry out a method according to embodiment of the invention. Embodiments of the invention may also be implemented as instructions stored on a machine-readable medium, which may be read and executed by one or more processors. A machine-readable medium may include any mechanism for storing or transmitting information in a form readable by a machine (e.g., a computing device). For example, a machine-readable medium may include read only memory (ROM); random access memory (RAM); magnetic storage media; optical storage media; flash memory devices; electrical, optical, acoustical or other forms of propagated signals (e.g. carrier waves, infrared signals, digital signals, etc.), and others. Further, firmware, software, routines, instructions may be described herein as performing certain actions. However, it should be appreciated that such descriptions are merely for convenience and that such actions in fact result from computing devices, processors, controllers, or other devices executing the firmware, software, routines, instructions, etc. and in doing that may cause actuators or other devices to interact with the physical world.

While specific embodiments of the invention have been described above, it will be appreciated that the invention may be practiced otherwise than as described. The descriptions above are intended to be illustrative, not limiting. Thus it will be apparent to one skilled in the art that modifications may be made to the invention as described without departing from the scope of the clauses set out below 1. An optical system for directing first and second laser pulses along an optical axis to a target to generate extreme ultraviolet radiation from said target comprising:
   - a first optical component configured to redistribute the first laser pulse to form a shaped laser pulse having a hollow region;
   - a second optical component configured to focus the shaped laser pulse toward the target; and, a third optical component configured to focus the second laser pulse toward the target within the hollow region of the shaped laser pulse, wherein the first, second and third optical components are coaxially arranged on the optical axis.

2. The optical system of clause 1, wherein the first and second laser pulses comprise different wavelengths.

3. The optical system of clause 1 or clause 2, wherein the first optical component and the third optical component are located on different surfaces of a single optical element.

4. The optical system of clause 3, wherein the first optical component is formed on a front side of the single optical element and the third optical component is formed on a back side of the single optical element.

5. The optical system of any preceding clause, comprising a radiation collector configured to receive extreme ultraviolet radiation emitted by the target, wherein the radiation collector comprises an aperture coaxially arranged on the optical axis and wherein the second and third optical components are configured to focus the shaped and second laser pulses through the aperture.

6. The optical system of any preceding clause, wherein the second optical component is configured to interact with the shaped laser pulse only and the third optical component is configured to interact with the second laser pulse only.

7. The optical system of any preceding clause, wherein the second optical component comprises an opening coaxially arranged on the optical axis.

8. The optical system of any preceding clause, wherein the third optical component is configured to focus a third laser pulse along the optical axis to the target within the hollow region of the shaped laser pulse, wherein the third laser pulse comprises a different wavelength to the first and second laser pulses.

9. An extreme ultraviolet radiation source comprising the optical system of any of clauses 1 to 8.

10. A lithographic system comprising the extreme ultraviolet radiation source of clause 9.

11. A method of directing first and second laser pulses along an optical axis to a target to generate extreme ultraviolet radiation from said target comprising:

using a first optical component to redistribute the first laser pulse to form a shaped laser pulse having a hollow region;

using a second optical component to focus the shaped laser pulse toward the target;

using a third optical component to focus the second laser pulse toward the target within the hollow region of the shaped laser pulse; and, coaxially arranging the first, second and third optical components on the optical axis.

12. The method of clause 11, wherein the first and second laser pulses comprise different wavelengths of radiation.

13. The method of clause 11 or clause 12, comprising locating the first optical component and the third optical component on different surfaces of a single optical element.

14. The method of clause 13, comprising:

locating the first optical component on a front side of the single optical element; and, locating the third optical component on a back side of the single optical element.

15. The method of any of clauses 11 to 14, comprising:

using a radiation collector to receive extreme ultraviolet radiation emitted by the target;

arranging an aperture of the radiation collector coaxially on the optical axis; and, using the second and third optical components to focus the shaped and second laser pulses through the aperture.

16. The method of any of clauses 11 to 15, comprising:

using the second optical component to interact with the shaped laser pulse only; and, using the third optical component to interact with the second laser pulse only.

17. The method of any of clauses 11 to 16, comprising:

providing an opening in the second optical component; and, coaxially arranging the opening on the optical axis.

18. The method of any of clauses 11 to 17, comprising using the third optical component to focus a third laser pulse along the optical axis to the target within the hollow region of the shaped pulse, wherein the third laser pulse comprises a different wavelength to the first and second laser pulses.

19. A method of projecting a patterned beam of radiation onto a substrate, comprising using the method of any of clauses 11 to 18 to generate extreme ultraviolet radiation.

20. A computer program comprising computer readable instructions configured to cause a computer to carry out a method according to any of clauses 11 to 19.

21. A computer readable medium carrying a computer program according to clause 20.

22. A computer apparatus comprising:

a memory storing processor readable instructions; and a processor arranged to read and execute instructions stored in said memory;

wherein said processor readable instructions comprise instructions arranged to control the computer to carry out a method according to any of clauses 11 to 19.

The invention claimed is:

1. An optical system for directing first and second laser pulses along an optical axis to a target to generate extreme ultraviolet radiation from the target, the system comprising:

a first optical component configured to redistribute the first laser pulse to form a shaped laser pulse having a hollow region;

a second optical component configured to focus the shaped laser pulse toward the target; and a third optical component configured to focus the second laser pulse toward the target within the hollow region of the shaped laser pulse, wherein the first, second and third optical components are coaxially arranged on the optical axis.

2. The optical system of claim 1, wherein the first and second laser pulses comprise different wavelengths.

3. The optical system of claim 1, wherein the first optical component and the third optical component are located on different surfaces of a single optical element.

4. The optical system of claim 3, wherein the first optical component is formed on a front side of the single optical element and the third optical component is formed on a back side of the single optical element.

5. The optical system of claim 1, further comprising a radiation collector configured to receive extreme ultraviolet radiation emitted by the target, wherein the radiation collector comprises an aperture coaxially arranged on the optical axis and wherein the second and third optical components are configured to focus the shaped and second laser pulses through the aperture.

6. The optical system of claim 1, wherein the second optical component is configured to interact with the shaped laser pulse only and the third optical component is configured to interact with the second laser pulse only.

7. The optical system of claim 1, wherein the second optical component comprises an opening coaxially arranged on the optical axis.

8. The optical system of claim 1, wherein the third optical component is configured to focus a third laser pulse along the optical axis to the target within the hollow region of the shaped laser pulse, and wherein the third laser pulse comprises a different wavelength than the first and second laser pulses.

9. An extreme ultraviolet radiation source comprising the optical system of claim 1.

10. A lithographic system comprising the extreme ultraviolet radiation source of claim 9.

11. A method of directing first and second laser pulses along an optical axis to a target to generate extreme ultraviolet radiation from the target, the method comprising:

using a first optical component to redistribute the first laser pulse to form a shaped laser pulse having a hollow region;

using a second optical component to focus the shaped laser pulse toward the target;

using a third optical component to focus the second laser pulse toward the target within the hollow region of the shaped laser pulse; and coaxially arranging the first, second and third optical components on the optical axis.

12. The method of claim 11, wherein the first and second laser pulses comprise different wavelengths of radiation, and the method further comprises:

locating the first optical component and the third optical component on different surfaces of a single optical element, or locating the first optical component on a front side of the single optical element and locating the third optical component on a back side of the single optical element.

13. The method of claim 11, further comprising:

using a radiation collector to receive extreme ultraviolet radiation emitted by the target;

arranging an aperture of the radiation collector coaxially on the optical axis; and using the second and third optical components to focus the shaped and second laser pulses through the aperture.

14. The method of claim 11, further comprising:

using the second optical component to interact with the shaped laser pulse only; and using the third optical component to interact with the second laser pulse only.

15. The method of projecting a patterned beam of radiation onto a substrate, comprising using the method of claim 11 to generate extreme ultraviolet radiation.

16. The method of claim 11, further comprising providing an opening in the second optical component and coaxially arranging the opening on the optical axis.

17. The method of claim 11, further comprising using the third optical component to focus a third laser pulse along the optical axis to the target within the hollow region of the shaped pulse, wherein the third laser pulse comprises a different wavelength to the first and second laser pulses.

* * * * *